United States Patent [19]
Temple et al.

[11] Patent Number: 5,185,055
[45] Date of Patent: Feb. 9, 1993

[54] METHOD OF FORMING A PATTERN ON A SURFACE

[75] Inventors: Stephen Temple, Cambridge; Stuart Speakman, Essex, both of United Kingdom

[73] Assignee: Xaar Limited, Cambridge, United Kingdom

[21] Appl. No.: 522,293

[22] Filed: May 11, 1990

[30] Foreign Application Priority Data

May 12, 1989 [GB] United Kingdom ............... 8910961

[51] Int. Cl.⁵ .............................................. B44C 1/22
[52] U.S. Cl. ................................... 156/630; 156/633; 156/659.1; 156/661.1; 156/643; 427/259; 427/272; 427/275; 427/282; 430/313; 430/315; 430/323; 430/324; 430/330
[58] Field of Search ............ 156/630, 629, 633, 661.1, 156/659.1, 656, 643, 275.7, 272.2; 427/97, 99, 272, 275, 282, 259; 430/330, 324, 323, 313, 315; 310/367, 365; 346/140 PD

[56] References Cited

U.S. PATENT DOCUMENTS

| | | | |
|---|---|---|---|
| 3,799,777 | 3/1974 | O'Keefe et al. | 156/661.1 X |
| 4,071,367 | 1/1978 | Collier et al. | 430/281 X |
| 4,218,532 | 8/1980 | Dunkleberger | 156/661.1 X |
| 4,571,374 | 2/1986 | Vikesland | 430/259 X |
| 4,599,628 | 9/1986 | Doring et al. | 346/140 PD |
| 4,672,020 | 6/1987 | Koelsch et al. | 430/259 X |
| 4,725,524 | 2/1988 | Elzer et al. | 430/259 X |
| 4,726,877 | 2/1988 | Fryd et al. | 156/630 |
| 4,752,788 | 6/1988 | Yasuhara et al. | 346/140 PD |
| 4,756,988 | 7/1988 | Kausch et al. | 430/256 X |
| 4,780,177 | 10/1988 | Wojnarowski et al. | 156/661.1 X |
| 4,853,080 | 8/1989 | Anthony | 156/661.1 X |
| 4,933,042 | 6/1990 | Eichelberger et al. | 156/275.5 X |

Primary Examiner—Thi Dang

[57] ABSTRACT

The method of forming a pattern on a substrate is described which includes first applying a film of thermo plastic material under pressure to a substrate. Energy is then supplied to dissipate heat at the surface of the film facing the substrate thereby to bond the film to the substrate. Next, areas of the film are selectively dry etched to form a predetermined pattern on the substrate and this is followed by depositing on the substrate in the areas where the film has been dry etched, a layer of patterning material. Finally, dry removal from the substrate is effected of the film remaining thereon. There is also described the application of this method to the manufacture of an array, drop-on-demand ink jet printer.

29 Claims, 5 Drawing Sheets

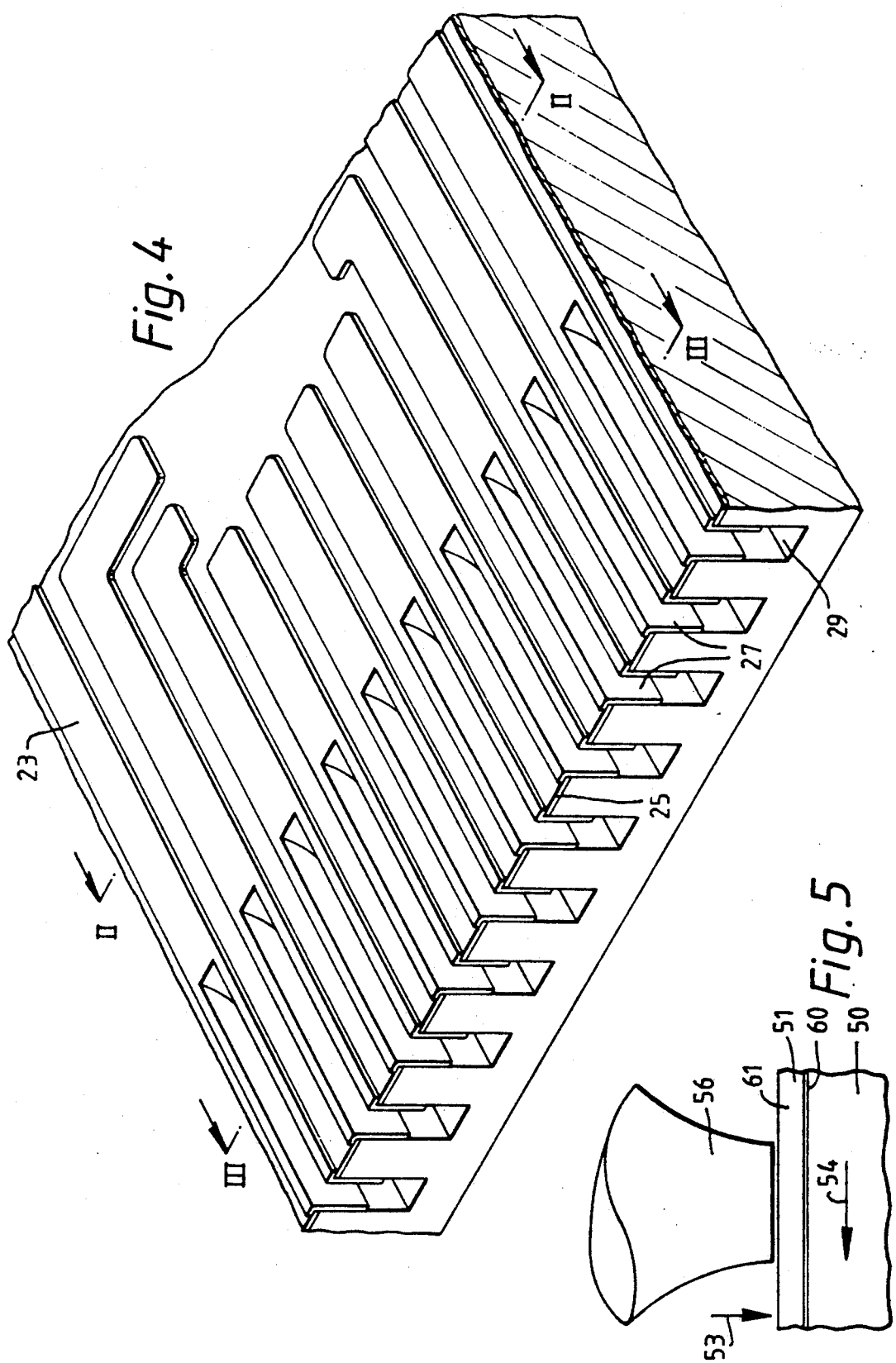

METHOD OF FORMING A PATTERN ON A SURFACE

This invention relates to a method of forming a pattern on a surface. A specific application of this method is that of laying down, on a surface, metal tracks for connection to an integrated circuit chip. Two known methods for effecting this are described hereinafter, one in relation to FIG. 1 of the accompanying drawings and a second method which is a variant thereof. The known methods are suitable for laying down tracks at high densities but are complex. involving large numbers, in excess of ten, steps. At lower densities, such as 5 to 20 tracks per millimetre it has been found that satisfactory results can be obtained by employing an improved method performed in significantly fewer steps than the known methods and in some forms of the method of the invention in steps which are rapidly performed and which can all be dry process steps. The method of the invention can also advantageously be performed in the manufacture of a drop-on-demand ink jet printhead made from a layer of piezo-electric material and having a high density array of parallel ink channels, the method here being employed both to effect deposition of metal electrodes on the facing side walls of the ink channels and to lay down tracks in alignment with the channels on an area of the piezo-electric material layer which adjoins the area in which the ink channels are formed and which respectively connect with the facing electrodes of the channels.

The present invention, in its broadest aspect consists in the method of forming a pattern on a substrate, characterized by the steps of:

(a) applying a film of thermoplastic material under pressure to a substrate;

(b) applying energy to heat said film at a surface thereof facing said substrate thereby to bond said film to said substrate;

(c) selectively dry etching areas of said film to form a predetermined pattern on said substrate;

(d) depositing on said substrate in the areas where said film has been etched a layer of patterning material; and (e) effecting dry removal from said substrate of said film remaining thereon.

Advantageously, the method includes forming an undercut by dry etching along edges of said etched areas of said film so that said edges of said film remaining on said substrate overhang edges of said pattern on said substrate. Suitably, the method may also comprise forming said undercut by providing said film on the side thereof remote from said substrate with a further film layer having a different etch rate than that of said film and of a thickness so related to the etch rate thereof that said undercut is formed during said selective etching of areas of said film.

In one form of the invention said film has a first thermoplastic bondable layer in engagement with said substrate and a second film strengthening layer on the side of said first layer remote from said substrate. Advantageously, the film is applied to said substrate by hot rolling action of a hot application roller.

In a further form, the method of the invention consists in applying the energy to heat said film in the form of radiant energy directed through said film for dissipation as heat at the surface thereof facing said substrate. Suitably the energy is directed through the film by infra-red lamps.

In another form of the invention the energy to heat the film is in the form of ultrasonic energy directed through said film for dissipation as heat energy at said surface of the film facing the substrate. Instead of heating the film at the surface adjacent the substrate by transmitting energy through the film, ultrasonic or radiant energy can be transmitted to the film through the substrate or by applying the film to a heated substrate.

The method of the invention, in one embodiment, is characterized by removing by means of a high energy beam said areas of said film to form on said substrate said predetermined pattern. Suitably the high energy beam is a laser beam directed at said film by way of, preferably, a projection mask, or alternatively, a contact mask.

In another form of the method of the invention a further predetermined pattern is formed by machining at least through said film.

In a further form, the method of the invention is characterized by forming said predetermined pattern by applying to said substrate a film having a first bondable layer, a second film strengthening layer and a third layer on the side of said second layer remote from said first layer formed of photo resist material, exposing in said photo resist material said predetermined pattern, developing said photo resist to provide said pattern therein over said second layer and forming said pattern on said substrate by dry etching areas both of said second layer on which said pattern is formed and of said first layer contiguous with said removed areas of said second layer.

The invention further consists in the method of forming a high density multi-channel array printhead body of a drop-on-demand printhead, characterized by applying to a layer of piezo-electric material a film of thermoplastic material, applying energy to heat said film at a surface thereof facing said piezo-electric material layer thereby to bond said film to said piezo-electric material layer, selectively removing areas of said film by dry etching thereof to form a predetermined pattern on said piezo-electric material layer, depositing on said piezo-electric material layer in the areas where said film has been removed a metallised layer and effecting dry removal from said piezo-electric material layer said film remaining thereon.

Suitably, a further pattern is formed on said piezo-electric material layer by sawing a multiplicity of parallel channels through said film and penetrating said piezo-electric material to provide in said piezo-electric material ink channels of said printhead.

BRIEF DESCRIPTION OF THE DRAWINGS

The invention will now be described, by way of example, with reference to the accompanying drawings in which:

FIG. 4 illustrates the location of Section II—II and III—III in the printhead corresponding to FIGS. 2 and 3.

FIG. 5 illustrates apparatus for bonding a film to a substrate in alternative manner to that illustrated in FIGS. 2 and 3.

DETAILED DESCRIPTION OF THE INVENTION

Figure 1A:
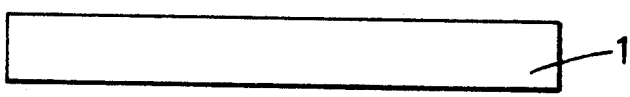
FIGS. 1(a)–(n) illustrate a sequence of procedures for conventional resist processing resulting in patterned vacuum metal deposition.
Figure 1B:
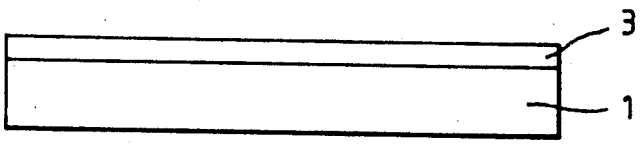
Figure 1C:
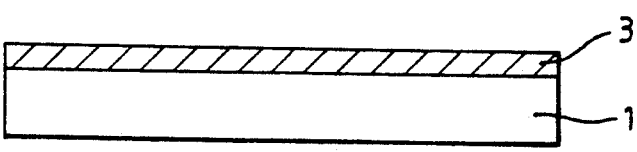
Figure 1D:
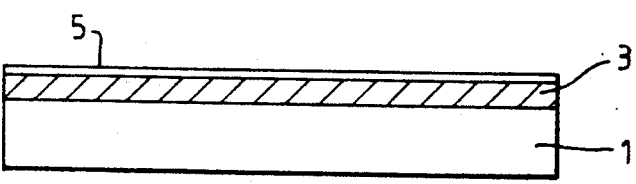
Figure 1E:
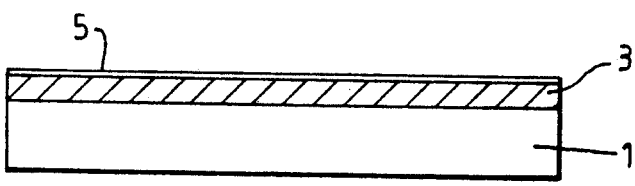
Figure 1F:
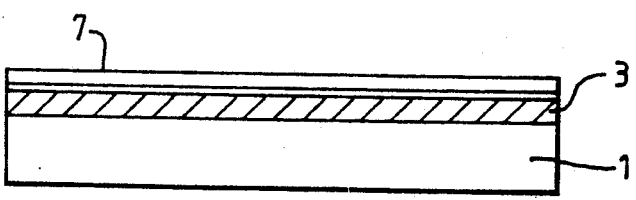
Figure 1G:
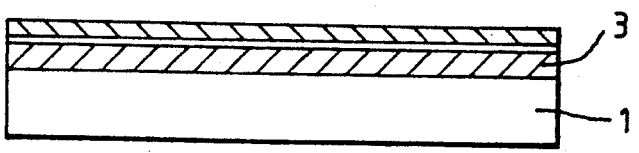
Figure 1H:
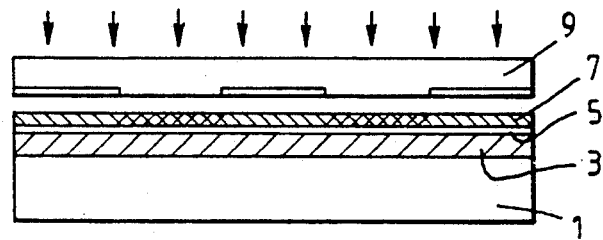
Figure 1I:
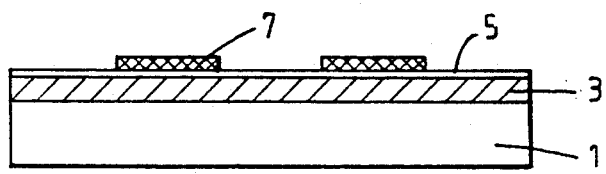
Figure 1J:
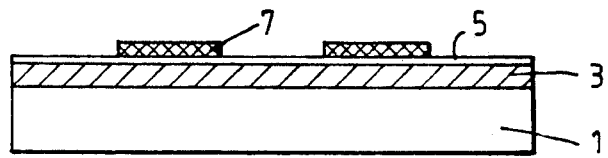
Figure 1K:
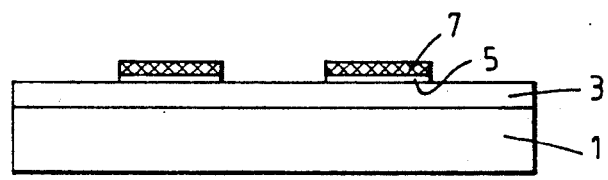
Figure 1L:
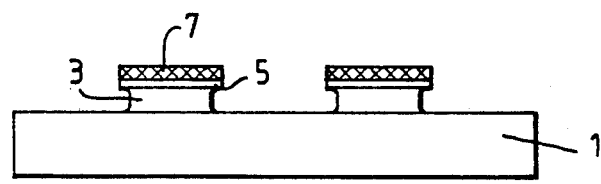
Figure 1M:
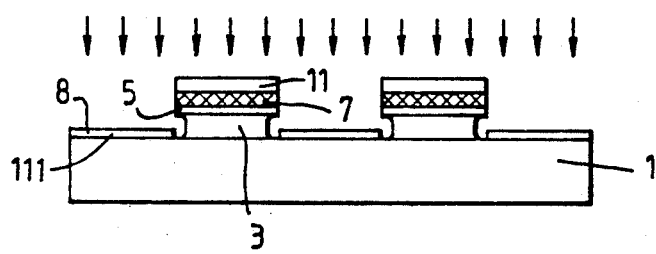
Figure 1N:
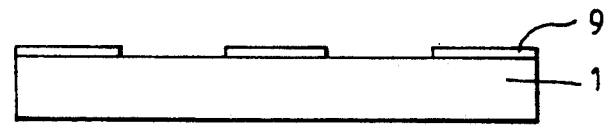

In the drawings, like parts are accorded the same reference numerals.

A conventional sequence of steps for resist processing resulting in vacuum metal deposition on a substrate in a predetermined pattern is shown in FIG. 1.

In the step 1(a) a substrate 1 is cleaned and treated to promote resist adhesion. Cleaning generally involves solvent and chemical washing or r.f. etching: adhesion promoters are primarily spray or dip coatings of siloxane or silanol groups which react with absorbed surface water molecules. In step 1(b) a first thick film coating 3 of resist is applied. In view of the application of current interest, which is the deposition of tracks for mounting integrated circuit chips whose lead density is in the general range 1-100 tracks per mm. resolution, dip or spray resist application is effective. Step 1(c) is a first pre-baking step to drive out the resist coating solvents at temperatures in the range 120-180 degrees C.

In U.S. Pat. No. 5,016,028 for a high density drop-on-demand printhead, a convenient procedure for actuator plating was disclosed. This method required angled plating of channel walls. In order to ensure lift off of the plating and resist layer on the top of the walls after such a plating step, it is necessary to provide an additional stabilising layer which will overhang the resist layer applied in 1(b) after pattern etching.

Step 1(d) in FIG. 1 indicates the deposition of a metal layer 5, 1-2 $\mu$m. thick by vacuum metal deposition to provide the necessary overhang at the periphery of the etch pattern and also, as will be described, an etch stop layer. Steps 1(e)-(g) essentially repeat steps 1(a)-(c) providing for the steps of cleaning and adhesion, deposition of a further overlayer 7 of a positive photo resist and a second pre-bake process.

Optical exposure of the overlayer 7 through a contact mask 9 in step 1(h) develops the pattern of the eventual metal tracks in the resist, which is next developed by spray application of developer and rinses in step 1(i), and dried in a further pre-bake stage to dry the patterned resist overlayer 7 in step 1(j). The metal layer 5 (typically copper or nickel) is next etched by chemical etching to impress the track pattern into the metal layer, as shown in step 1(k). The last preparative step is to dissolve or etch the first resist layer in the same pattern of tracks. This process is timed to marginally undercut and provide an overhang formed by the metal layer over the periphery of the pattern of tracks 8 to be deposited, as illustrated in step 1(l). Care is taken to clean the substrate surface prior to track metal deposition.

Following this sequence of steps, in step 1(m) metal 111 which includes the tracks 8 is deposited in the channels formed in the resist layer 3 reproducing the track pattern exposed in step 1(h). Finally, in step 1(n) a solvent is applied which swells the residual resist effecting lift off from the substrate. The complete cycle to deposit the metal track pattern incurs 14 steps. This represents the application of practices used for track formation in integrated circuit manufacture.

In a modified form of this known method instead of metal layer 5 there is deposited a negative photo resist coating after which a further pre-bake takes place. This overlayer of resist on development is hardened forming a layer which is able to resist dissolution of the first resist layer and so replace the metal overhang. In this case the track deposition involves twelve steps. Using wet chemistry both these known processes create chemical wastes which have to be disposed of.

The mean spacing of tracks in the application of interest lies in the range 5-20 tracks per mm. and is relatively coarse compared with prevailing practices using resists in integrated circuit manufacture. Thus, for this and similar applications it is advantageous to have a simplified sequence of manufacturing steps which the present invention provides and which is described in relation to FIG. 2 which shows a section II—II of FIG. 4 at various stages of the process. In the embodiment described in relation to FIG. 2 five or six steps are involved, and it will be seen that wet chemistry process steps have been avoided in the preferred masking procedure. The invention is not however restricted to the use of dry process steps and, as will be noted, wet process steps are mentioned as additions to the preferred dry process steps.

In step 2(a) the substrate is cleaned and degreased for which r.f. plasma etching is suitable. Step 2(b) requires the hot roll application of a three layer thermoplastic film 10. In the film a base or first bondable layer 11 is a meldable or hot melt layer suitable to bond to the substrate 1 by rolling action of a hot application roller: a second layer 13 of the film is a high strength sheet of polymer, for example, a stretched polyester, which provides the major part of the film thickness and strength. The third or top layer is then an overcoat 15 of a material which is more resistant to etching in step 2(d) hereinafter described, than the first two layers. The presence of the third layer whilst preferable is not mandatory. The overall thickness of the film can be 10-50 $\mu$m. depending on the track resolution and plating deposition angles also referred to hereinafter.

Step 2(c) introduces the impression of the track pattern into the bonded film by laser ablation. In this process the film is ablated by the application of high energy UV. pulses of light taken from an excimer laser, preferably through a projection pattern mask though a contact mask can be employed instead. Typically 0.5-1 $\mu$m of the film is ablated per pulse at rates up to 1-200 pulses per second, which provides a rapid manufacture procedure.

Following laser ablation of the track pattern in the film, the film is preferably further etched in step 2(d) to form an undercut 17 by removing the first and second film layers laterally under the third layer resistant overcoat. The provision of an undercut is not essential in all procedures according to the invention and, when not employed, the presence of the third layer of the film is not required. The further etching can be effected by ion, r.f. or plasma etching where the overcoat is chosen to be more resistant to the etchant process than the two underlayers. These are dry vacuum etchant processes. A further potential process by which the tracks can be undercut in the film would be laser ablation through a contact mask during rocking of both the substrate and film and also the mask. The rocking angle in this case will be the same or marginally greater than the plating angles in subsequent step 3(e) described in relation to FIG. 3. The principal difficulty presented by this approach is the tendency for the mask to heat up and buckle away from the substrate during ablation. This, however, can be overcome by applying a mirror coat to the contact mask or limiting the laser pulse frequency by ablating a number of components sequentially. If laser ablation is implemented to undercut the tracks it will be evident that step 2(d) can be performed as a continuation of step 2(c) if the latter step is carried out using a contact mask rather than a projection mask.

A suitable three layer film is provided by the meldable Melinex ® 301 and 343 made by Imperial Chemical Industries coated with a thin third or top layer of cured resin. The 301 and 343 films comprise a first layer of polyester copolymer whose melt temperature is selectable for roll on application and a second layer of high strength, stretched polyester.

Figure 2A:
FIG. 2(a)–(f) shows a sequence of steps to effect deposition of patterning material according to the invention.
Figure 2B:
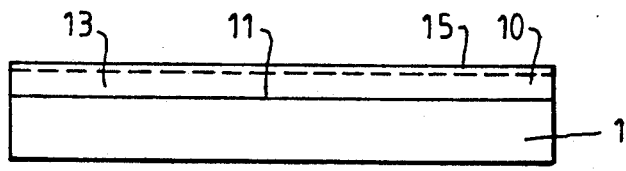
Figure 2C:
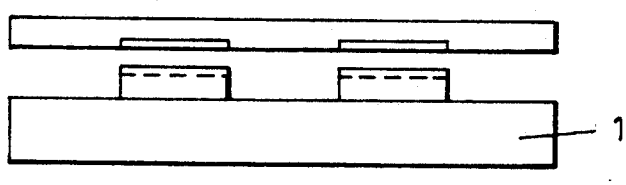
Figure 2D:
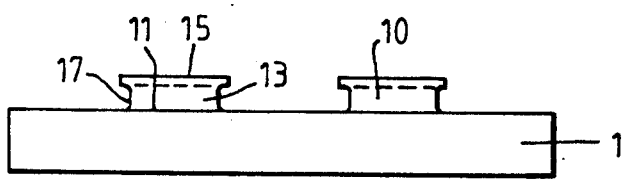
Figure 2E:
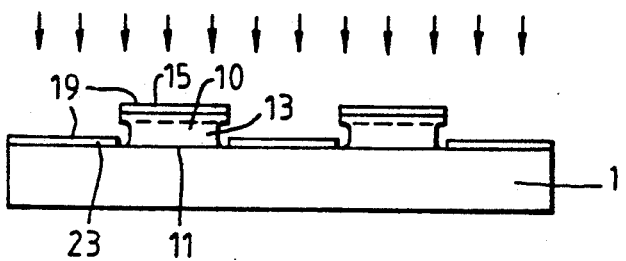
Figure 2F:
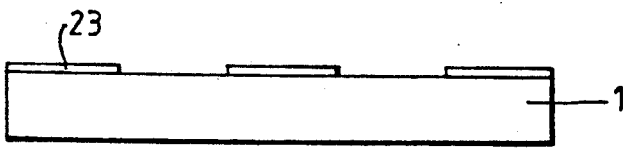

Step 2(e) illustrates metal deposition of metal layer 19, in which the direction of vacuum metal deposition is shown by directional arrows 21. Angled metal deposition which is a feature of the manufacturing process of the printhead described by reference to FIGS. 3 and 4 can also be catered for, provided the etch overhang is sufficient to facilitate lift off of the residual film. FIG. 2(f) shows the final pattern of tracks 23 after lift off of the residual film by application of heat which softens the melded bond layer and enables the residual film to be stripped off. The overhang of the resist third layer ensures that the deposited metal over the top of the flm is not connected to the top of the tracks, facilitating clean lift off. However, the portions of the metal layer deposited over the film and the exposed areas of the substrate are both mechanically strong, whereas metal deposited on the side walls of the ablated material is relatively thin. Consequently in some applications it is possible to strip off the film after plating when the undercutting or etching step 2(d) is omitted.

Accordingly, by use of a customised melded or hot melt film in which a track pattern is formed by laser ablation, a new process of masking tracks produced by vacuum metal deposition in relatively coarse resolution range of 1-100 per mm. is provided. The process has a reduced number of operations each being fast and economic to implement. A further advantage is that the entire mask application and removal sequence can be carried out inside the metal deposition vacuum chamber and is free of wet chemistry operations.

The above masking procedure has also been found particularly suitable for plating the channels walls of the printhead described in U.S. Pat. No. 5,016,028 , in a process where the contact plating of the channel walls and the deposition of tracks for connection to a drive circuit are produced at the same time. The procedure is described by reference to FIG. 3, which is section III-—III of FIG. 4.

Figure 3A:
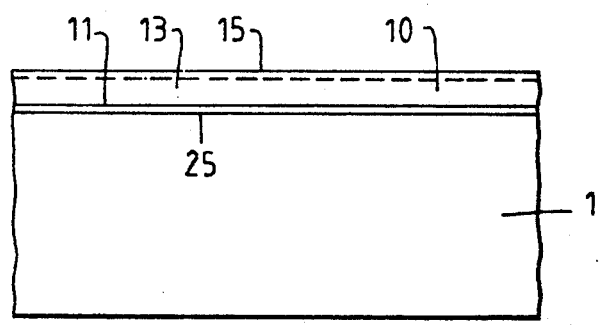
FIG. 3(a)–(e) shows the sequence of steps applicable to plating the channels of an ink jet printhead providing lift off of the plating over the top of the channel walls.

FIG. 3(a) shows a Piezoelectric, PZT, substrate suitably for the printhead described U.S. Pat. No. 5,016,028 or another suitable high density ink jet array printhead. This has been coated with a layer 25 of Silicon Nitride (Si—N) which serves to harden the top surface to prevent chipping of the actuator walls in subsequent operations and to planarise the surface. It also serves to isolate tracks deposited on the substrate surface from coupling through the high dielectric PZT as illustrated in FIG. 3(e). The substrate 1 after coating with layer 25 is cleaned and degreased and the three layer film described above attached by hot roll application.

Figure 3B:
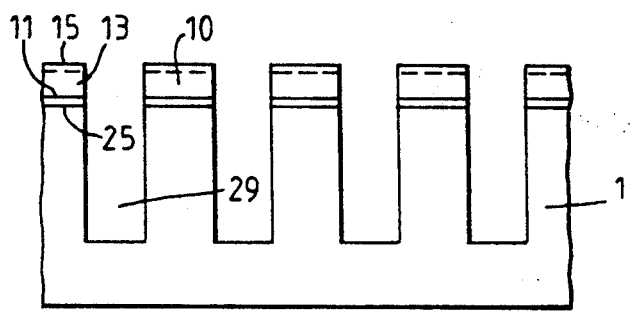
Figure 3C:
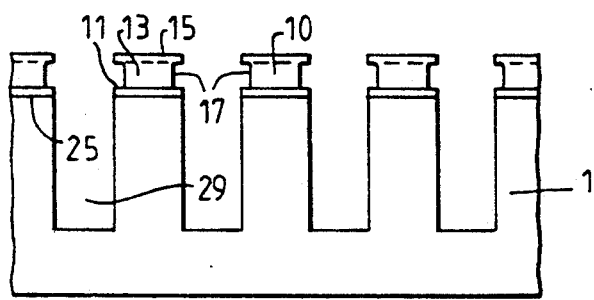

For FIG. 3(b) ink channels 29 are formed through the film and substrate generally as described in U.S. Pat. No. 5,016,028, by machining using abrasive discs hereinafter referred to as "disc sawing" or simply "sawing". The roll-on film is next etched, as shown in FIG. 3(c), to form undercut 17 in the layers 11 and 13 and form an overhang from the top etch resistant layer. The laser ablation step 2(c) is not applicable in the channel region since the channels and the overlaying film are cut together in the sawing operation. However, it will be seen in the sequence described under FIG. 2 that the tracks 23 which are required to connect with the plating on the channel walls are formed by laser ablation of the three layer film. The channel region is therefore masked during ablation.

Figure 3D:
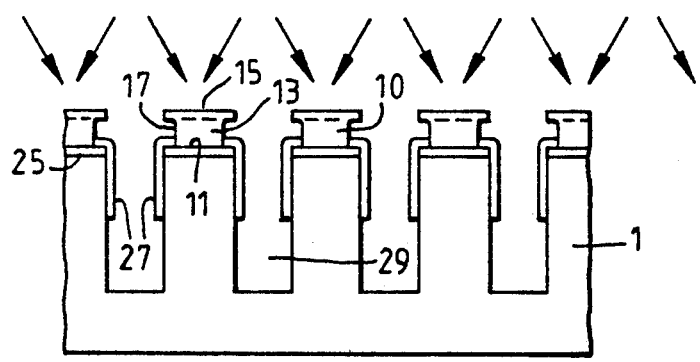
Figure 3E:
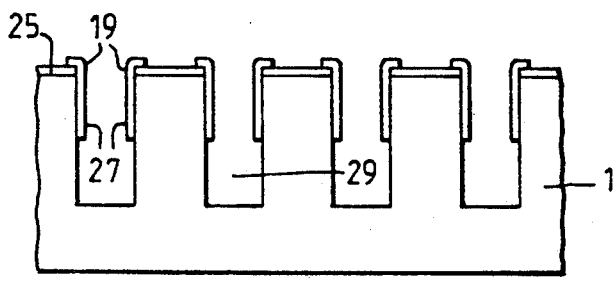

Angled plating is shown in FIG. 3(d) and 3(e) and is as described in U.S. Pat. No. 5,016,028 (which is incorporated herein by reference). This cause the actuator walls to be plated as at 27. The film 10 over the walls is lifted or stripped off leaving the plating 27 as shown in FIG. 3(e), the tensile strength of the plated layer on the film and the film itself being strong enough on application of heat to lift integrally the unwanted metal coating and film. A cleaning operation is later applied.

FIG. 4 illustrates the plated channels and tracks in a scrap section of the printhead after the plating step.

Referring now to FIG. 5, there is shown therein an alternative way of bonding a film 51 to a substrate 50, which in the case of a shear mode actuated drop-on-demand printhead would be piezo-electric material. The film shown has a thermoplastic bond layer 60 and a further film strengthening layer 61. Although the film could comprise a single thermoplastic layer, where an undercut is to be provided at the edges of selectively removed areas of the film, the further film layer is desirable though not essential where etching and undercutting takes place by laser ablation accompanied by relative rocking of the laser beam and the film and substrate.

For bonding the film to the substrate 50 the film and substrate is moved in the direction of arrow 54 past a guide tube 56 through which ultrasonic energy, suitably in the range 20-200 KHz, is directed through the film and dissipates as heat at the interface of the film and substrate so that the film is softened at its surface opposed to the substrate. Pressure is applied as indicated by arrow 53 once the film and substrate have passed the guide tube 56 and the softened film is thereby securely bonded to the substrate. Instead of ultrasonic energy there may be employed radiant energy, suitably provided by infra-red lamps disposed to direct energy through the film towards the interface of the film and substrate. The film 51 should, preferably, be substantially transparent to the energy which it transmits to that interface.

Where undercutting of removed areas of film is effected with a film having layers 60 and 61, the further film layer 61 has to have a different etch rate from that of layer 60 and its thickness is chosen in relation to that of the layer 61 so that the etching takes place so as to leave the upper edges of the layer 61 overhanging the edges of the areas of the substrate surface to which the film is bonded from which the film 51 has been removed.

It will be evident that roll on films consisting of numerous alternative materials or material combinations can be developed to provide a convenient mask and lift off method for patterned tracks of metal plating or other deposited materials.

Thus, for example, the film may be provided with first and second layers as described and a third layer of photo resist on the side of the second layer remote from the first layer. In this case the desired pattern is exposed into the resist layer by means of a suitable mask and light source and the film is then developed and rinsed to leave the desired pattern revealed on the second layer. To form the pattern on the substrate, these revealed pattern areas are then treated by dry etching to effect removal of the first and second layers which they overlie with or without undercut so that plating of the substrate with suitable patterning material can thereafter take place as described.

Another method of removing the first and second layers to reveal the pattern on the substrate is to apply to the substrate a four layer film having the three layers described and a fourth metallised layer between the second and third layers. With this film the pattern is formed on the metallised layer by exposing and developing the third photo resist layer whereupon removal of the revealed areas of the metallised layer and of the second and first layers immediately below those revealed areas is effected by the processes, known per se, of ion beam milling, or reactive ion etching.

Suitable methods, which are known per se, for depositing plating material on the substrate are ion assisted electron beam evaporation, dual beamsputtering, magnetron sputtering, ion plating, plasma enhanced vapour deposition, cluster ion beam sputtering, electroless plating or electrolytic plating.

Dry removal of residual film after the plating stage may also be accomplished in other ways e.g. plasma assisted vapour etching of the first or first and second film layers, or heating in the presence of vapour to remove the first or first and second film layers.

We claim:

1. The method of forming a pattern on a substrate, characterized by the steps of:
   (a) applying a film of thermoplastic material under pressure to a substrate;
   (b) applying energy to heat said film at a surface thereof facing said substrate thereby to bond said film to said substrate;
   (c) selectively dry etching areas of said film to form a predetermined pattern on said substrate;
   (d) depositing on said substrate in the areas where said film has been etched a layer of patterning material; and
   (e) effecting dry removal from said substrate of said film remaining thereon.

2. The method claimed in claim 1, characterized by forming, by dry etching when or after selectively dry etching areas of said film to form said predetermined pattern, an undercut along edges of said etched areas of said film so that said edges of said film remaining on said substrate overhang edges of said pattern on said substrate.

3. The method claimed in claim 2, characterized by forming said undercut by providing said film on the side thereof remote from said substrate with a further film layer having a different etch rate than that of said film and of a thickness so related to the etch rate thereof that said undercut is formed during said selective etching of areas of said film.

4. The method claimed in claim 1, characterized in that said film has a first thermoplastic bondable layer in engagement with said substrate and a second film strengthening layer on the side of said first layer remote from said substrate.

5. The method claimed in claim 4, characterized by applying said film to said substrate by hot rolling action of a hot application roller.

6. The method claimed in claim 1, characterized by applying the energy to heat said film in the form of radiant energy directed through said film for dissipation as heat at the surface thereof facing said substrate.

7. The method claimed in claim 6, characterized in that the radiant energy is directed through said film by means of infra-red lamps.

8. The method claimed in claim 1, characterized by applying the energy to heat said film in the form of ultrasonic energy directed through said film for dissipation as heat energy at said surface of the film facing the substrate.

9. The method claimed in claim 8, characterized by applying said ultrasonic energy at about 20 to 100 KHz frequency.

10. The method claimed in claim 1, characterized by applying said energy to heat said film at said surface of the film facing the substrate by way of said substrate.

11. The method claimed in claim 10, characterized by applying said energy to heat said film at said surface thereof facing said substrate by heating said substrate.

12. The method claimed in claim 10, characterized by applying said energy to said film by transmitting radiant energy through said substrate.

13. The method claimed in claim 10, characterized by applying said energy to said film by transmitting ultrasonic energy through said substrate.

14. The method claimed in claim 13, characterized by employing said ultrasonic energy at a frequency of about 20 to 100 KHz.

15. The method claimed in claim 1, characterized by etching by means of a high energy beam said areas of said film to form on said substrate said predetermined pattern.

16. The method claimed in claim 15, characterized in that said high energy beam is a laser beam directed at said film by way of a projection mask.

17. The method claimed in claim 15, characterized in that said high energy beam is a laser beam directed at said film by way of a contact mask.

18. The method claimed in claim 15, characterized by employing an excimer laser beam as said high energy beam.

19. The method claimed in claim 1, characterized by forming a further predetermined pattern in said substrate by machining at least through said film.

20. The method claimed in claim 1, characterized by forming said predetermined pattern by applying to said substrate a film having a first bondable layer, a second film strengthening layer and a third layer on the side of said second layer remote from said first layer formed of photo resist material, exposing in said photo resist material said predetermined pattern, developing said photo resist to provide said pattern therein over said second layer and forming said pattern on said substrate by dry etching areas both of said second layer on which said pattern is formed and of said first layer contiguous with said removed areas of said second layer.

21. The method claimed in claim 20, characterized by providing between said second and third layers a metallised layer on which said pattern is formed by developing said third layer to expose said pattern on said metallised layer, and removing by ion beam milling said areas of said metallised layer on which said pattern is formed and said second and first layers immediately below said removed areas of said metallised layer.

22. The method claimed in claim 20, characterized by providing between said second and third layers a metallised layer on which said pattern is formed by developing said third layer to expose said pattern on said metallised layer, and removing by reactive ion etching said areas of said metallised layer on which said pattern is formed and said second and first layers immediately below said removed areas of said metallised layer.

23. The method claimed in claim 1, characterized by depositing metal on said substrate as the patterning material in the areas where said film has been removed to form said predetermined pattern.

24. The method of forming a high density multi-channel array printhead body of a drop-on-demand printhead, characterized by applying to a layer of piezo-electric material a film of thermoplastic material, applying energy to heat said film primarily at a surface thereof facing said piezo-electric material layer thereby to bond said film to said piezo-electric material layer, selectively removing areas of said film by dry etching thereof to form a predetermined pattern on said piezo-electric material layer, depositing on said piezo-electric material layer in the areas where said film has been removed a metallised layer and effecting dry removal from said piezo-electric material layer said film remaining thereon.

25. The method claimed in claim 24, characterized by forming a part of said predetermined pattern on said piezo-electric material layer by machining a multiplicity of parallel channels through said film and penetrating said piezo-electric material to provide in said piezo-electric material ink channels of said printhead.

26. The method claimed in claim 25, characterized by forming said film on a side thereof remote from said substrate with a second film strengthening layer and a third resist layer on the side of said second layer remote from said first layer and forming by dry etching in said film, prior to metal deposition an undercut at edges of areas of said film which were removed by dry etching to form said predetermined pattern on said piezo-electric material layer.

27. The method claimed in claim 26, characterized by angle plating with metal facing side walls of said channels.

28. The method claimed in claim 27, characterized by providing said predetermined pattern in that part thereof adjoining said plated channels as metal connection tracks each connecting with the plated side walls of a corresponding channel.

29. The method of forming a pattern on a substrate, characterized by the steps of:
 (a) applying a film of thermoplastic material under pressure to a substrate;
 (b) applying energy to heat said film at a surface thereof facing said substrate thereby to bond said film to said substrate;
 (c) selectively dry etching areas of said film to form a predetermined pattern on said substrate; and
 (d) depositing on said substrate in the areas where said film has been etched a layer of patterning material.

* * * * *